US009225294B2

(12) United States Patent
Huang et al.

(10) Patent No.: US 9,225,294 B2
(45) Date of Patent: Dec. 29, 2015

(54) AMPLIFIER WITH IMPROVED NOISE REDUCTION

(71) Applicant: QUALCOMM Incorporated, San Diego, CA (US)

(72) Inventors: Wenchang Huang, San Diego, CA (US); Vijayakumar Dhanasekaran, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 105 days.

(21) Appl. No.: 14/078,050

(22) Filed: Nov. 12, 2013

(65) Prior Publication Data

US 2015/0002228 A1    Jan. 1, 2015

Related U.S. Application Data

(60) Provisional application No. 61/840,831, filed on Jun. 28, 2013.

(51) Int. Cl.
| | |
|---|---|
| H03F 1/14 | (2006.01) |
| H03F 1/30 | (2006.01) |
| H03F 3/187 | (2006.01) |
| H03F 3/30 | (2006.01) |
| H03F 3/72 | (2006.01) |

(52) U.S. Cl.
CPC ............... H03F 1/305 (2013.01); H03F 3/187 (2013.01); H03F 3/3022 (2013.01); H03F 3/72 (2013.01); *H03F 2200/03* (2013.01); *H03F 2200/381* (2013.01); *H03F 2200/411* (2013.01); *H03F 2200/453* (2013.01); *H03F 2200/456* (2013.01); *H03F 2203/45136* (2013.01); *H03F 2203/7236* (2013.01)

(58) Field of Classification Search
CPC .................... H02M 2001/0032; H02M 3/337; H03F 2200/102; H03F 2200/451; H03F 1/0227; H03F 1/0238; H03F 2200/105; H03F 2200/429; H03F 2200/432; H03F 3/191; H03F 3/195; H03F 3/245; H03F 1/00; H03F 1/0205
USPC ............................................ 330/51; 381/94.5
See application file for complete search history.

(56) References Cited

U.S. PATENT DOCUMENTS

| | | |
|---|---|---|
| 5,537,081 A | 7/1996 | Naokawa et al. |
| 6,346,854 B1 | 2/2002 | Heithoff |
| 6,940,345 B2 * | 9/2005 | Nair et al. ........................ 330/51 |
| 7,254,244 B2 | 8/2007 | Henson et al. |
| 7,902,898 B2 * | 3/2011 | Tseng ............................ 327/266 |
| 8,080,987 B1 | 12/2011 | Qiu et al. |
| 8,390,345 B2 | 3/2013 | Kim et al. |
| 8,503,695 B2 | 8/2013 | Chilakapati et al. |

(Continued)

OTHER PUBLICATIONS

International Search Report and Written Opinion—PCT/US2014/042965—ISA/EPO—Nov. 5, 2014, 12 pages.

*Primary Examiner* — Khanh V Nguyen
(74) *Attorney, Agent, or Firm* — Toler Law Group, PC

(57) ABSTRACT

An amplifier with improved noise reduction is disclosed. In an exemplary embodiment, an apparatus includes at least one capacitor configured to receive an adjustable current and generate a corresponding ramp voltage configured to control coupling between a main amplifier output and a secondary amplifier output. The apparatus also includes at least one comparator configured to adjust the adjustable current to generate the ramp voltage with selected ramp-up or ramp-down voltage characteristics.

20 Claims, 8 Drawing Sheets

(56) References Cited

U.S. PATENT DOCUMENTS

| | | | |
|---|---|---|---|
| 8,525,713 B2 * | 9/2013 | Wang .......................... 341/118 |
| 2005/0140432 A1 | 6/2005 | Nair et al. | |
| 2009/0196435 A1 | 8/2009 | Miao | |
| 2011/0007912 A1 | 1/2011 | Thompson | |
| 2013/0002348 A1 | 1/2013 | Dhanasekaran | |
| 2013/0156230 A1 | 6/2013 | Dhanasekaran | |

* cited by examiner

US 9,225,294 B2

AMPLIFIER WITH IMPROVED NOISE REDUCTION

CLAIM TO PRIORITY

This patent application claims the benefit of priority from U.S. Provisional Patent Application No. 61/840,831, entitled "AMPLIFIER WITH IMPROVED NOISE REDUCTION" filed on Jun. 28, 2013, and assigned to the assignee hereof and hereby expressly incorporated by reference herein.

BACKGROUND

1. Field

The present application relates generally to the operation and design of amplifiers, and more particularly, to amplifiers with improved noise reduction.

2. Background

There is an increasing demand to provide high quality audio and video from a variety of user devices. For example, handheld devices are now capable of rendering high definition video and outputting high quality multichannel audio. Such devices typically require audio amplifiers that are designed to provide high quality signal amplification.

Click and pop (CnP) noise during startup and/or shutdown is a common problem in audio amplifiers. Various factors contribute to generating this type of noise, for example, glitches produced during power-up and power-down, amplifier offset voltages, and glitches or voltage offsets associated with the signal source. Extremely low levels of click and pop noise (i.e., less than 100 micro volts) may be needed especially for headphone amplifiers.

Therefore, it is desirable to have an amplifier with improved noise reduction.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
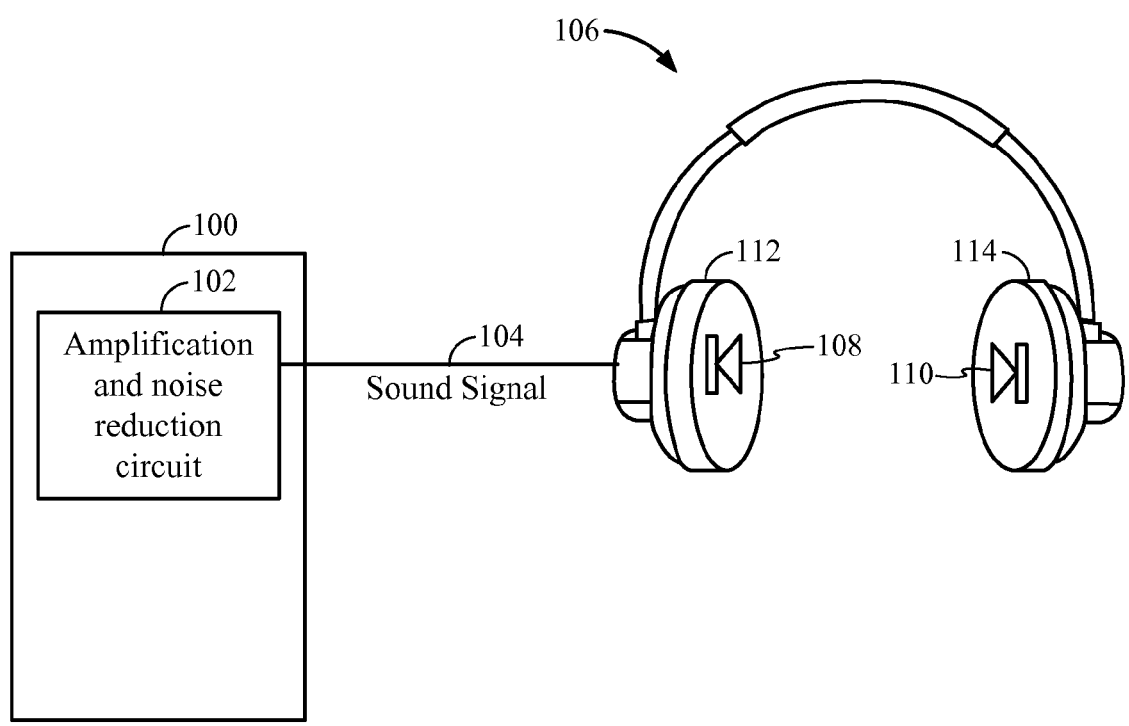
FIG. 1 shows an exemplary embodiment of a device comprising a novel amplification and noise reduction circuit.

FIG. 1 shows an exemplary embodiment of a device 100 comprising a novel amplification and noise reduction circuit 102. For example, the circuit 102 is suitable for use to reduce, minimize or eliminate CnP noise from an amplified sound signal 104 provided to a headset 106. The sound signal 104 is then converted to audio sounds by speakers 108 and 110 located in ear cups 112 and 114 of the headset 106.

During operation, the circuit 102 provides amplification and noise reduction. Typically, CnP noise may appear on the sound signal 104 during amplifier startup and/or shutdown. In various exemplary embodiments, the circuit 102 comprises noise reduction circuitry configured to reduce, minimize or eliminate CnP noise from the sound signal 104. Thus, a user of the headset 106 may not hear any click or pop noise during startup or shutdown of sound reproduction. A more detailed description of exemplary embodiments of the amplification and noise reduction circuit 102 is provided below.

Figure 2:
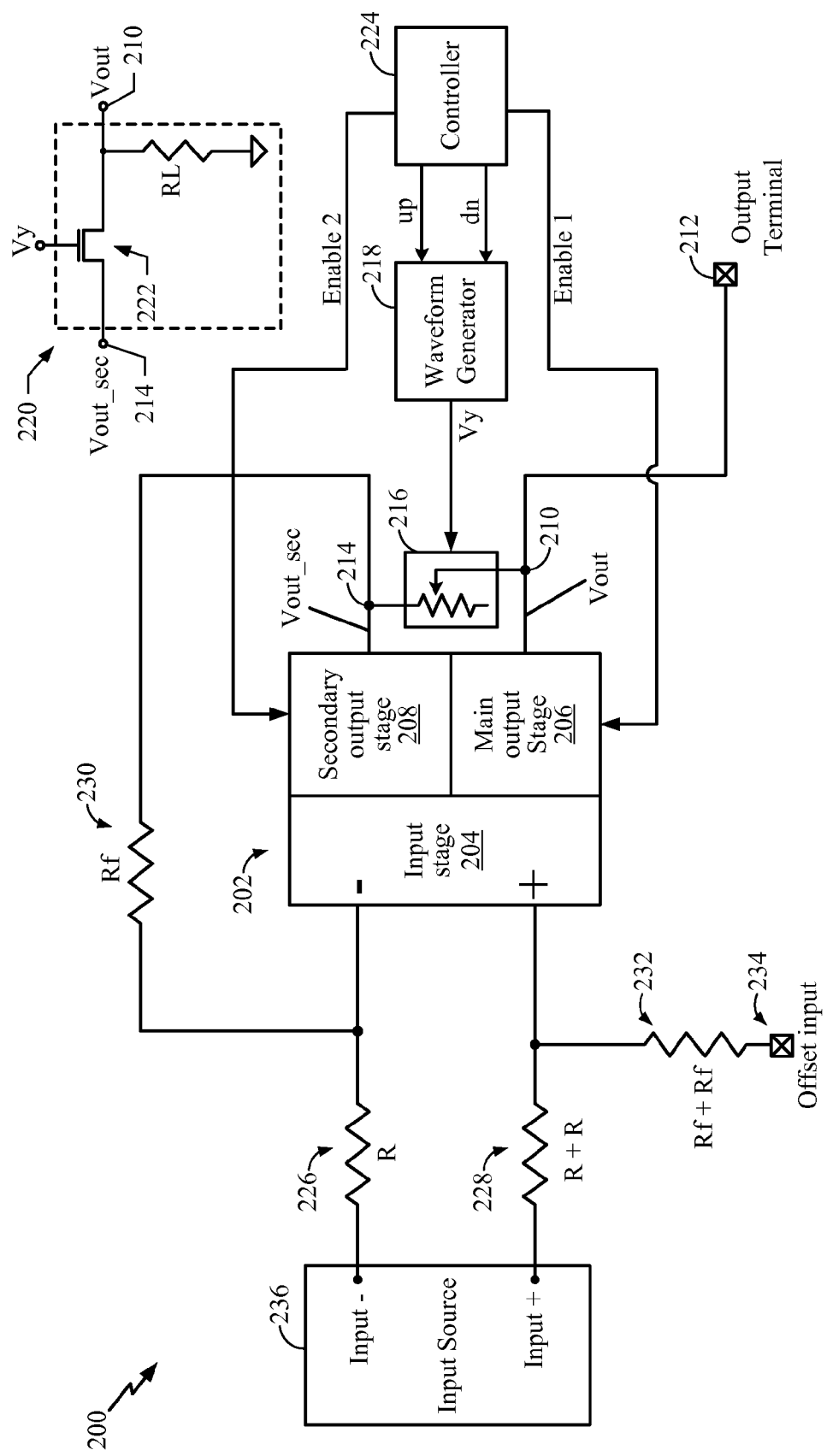
FIG. 2 shows an exemplary detail embodiment of a novel amplifier circuit that provides amplification and noise reduction.

FIG. 2 shows an exemplary embodiment of an amplifier circuit 200 that provides amplification with noise reduction in accordance with the various embodiments. For example, the amplifier circuit 200 is suitable for use as the amplification circuit 102 in the device 100 shown in FIG. 1 to provide audio signal amplification with noise reduction. The circuit 200 comprises an amplifier 202 that comprises an input stage 204 coupled to both of a main output stage 206 and a secondary output stage 208. The input stage 204 is connected to receive an input signal, which in one implementation comprises an audio signal to be amplified. The input signal is provided by an input source 236. The input stage 202 amplifies the input signal to generate an intermediate signal that is coupled to both the main 206 and secondary 208 output stages. Although described as a single input stage, in other implementations, the input stage 204 comprises multiple stages.

The main output stage 206 is configured to amplify the intermediate signal to produce a main amplified signal (Vout) at a main output terminal 210. The main output terminal 210 is connected to an amplifier output terminal 212 that allows the amplified signal to be routed to other circuit components. The secondary output stage 208 is configured to amplify the intermediate signal to produce a secondary amplified signal (Vout_sec) at a secondary output terminal 214. The secondary amplified signal is a copy (or a second version) of the main amplified signal.

The main output terminal 210 and the secondary output terminal 214 are connected to a signal coupler 216. The signal coupler 216 provides a variable coupling resistance between the secondary output terminal 214 and the main output terminal 210. The signal coupler 216 operates to set the coupling resistance based on a coupling waveform (Vy) that is received from a waveform generator 218. The waveform generator 218 generates the coupling waveform Vy in response to "up" and "dn" signals received from a controller 224. For example, as the voltage level of the coupling waveform Vy increases, the coupling resistance of the signal coupler 216 decreases thereby adjusting how the secondary amplified signal at terminal 214 is coupled to appear at the main output terminal 210. Thus, it is possible for the coupling waveform Vy to set the resistance of the signal coupler 216 to a minimum resistance value to provide full coupling and to a maximum resistance value to provide full uncoupling.

In an exemplary embodiment, the signal coupler 216 can be implemented as the signal coupler 220. For example, the signal coupler 220 comprises a transistor 222 (i.e., NMOS transistor, PMOS transistor or a combination of both) with a gate terminal connected to the coupling waveform (Vy) and source/drain terminals connected to the main output terminal 210 and the secondary output terminal 214. The transistor 222 is connected to a load resistor RL and to the various signal terminals as shown. It should be noted that other implementations of the signal coupler are possible.

The main output stage 206 is configured to receive a first enable signal (Enable 1) from the controller 224 at the device that enables/disables the operation of the main output stage 206. In the disabled state, the main output stage 206 is in a high impedance state. The secondary output stage 208 is configured to receive a second enable signal (Enable 2) from the controller 224 that enables/disables the operation of the secondary output stage 208. In the disabled state, the secondary output stage 208 is in a high impedance state. In an exemplary embodiment, the secondary output stage 208 and signal coupler 216 have a topology that is chosen such that offset contributors remain substantially the same as the main output stage 206.

The input signal to be amplified is coupled to input resistances 226 and 228. The output of the resistance 226 is connected to an inverting input of the input stage 204. A feedback resistor 230 is connected between the secondary output terminal 214 of the secondary output stage 208 and the inverting input of the input stage 204. The output of the resistance 228 is connected to the non-inverting input of the input stage 204. A resistance 232 is coupled to receive an offset input voltage that appears at terminal 234. The resistance 232 is also connected to the non-inverting input of the input stage 204. During amplifier startup (also referred to herein as power-up) and shutdown (also referred to herein as power-down) operations, the main output stage 206, secondary output stage 208 and signal coupler 216 are controlled to reduce noise at the output terminal 212. For example, the two stages 206/208 are controlled by the controller 224 and the signal coupler 216 to reduce click and pop noise so that this noise does not appear at the amplifier output terminal 212. During operation, one or more of the following functions are performed at power-up to amplify an input signal and reduce noise at the amplifier output terminal 212.

The main output stage 206 is disabled and the secondary output stage 208 is enabled. The "up" and "dn" signals output from the controller 238 are in the disabled state.

The controller 224 enables the "up" signal that is input to the waveform generator 218, which causes the Vy signal to ramp up.

The secondary output terminal 214 is coupled to the main output terminal 210 based on the coupling waveform Vy output from the waveform generator 218.

During coupling based on the coupling waveform, click and pop noise at the amplifier output terminal 212 is reduced.

After a selected coupling interval completes (i.e., the ramp up of the Vy signal is complete), the main output stage 206 is enabled and the secondary output stage 208 is disabled.

Similarly, during power-down, one or more of the following functions are performed to reduce noise at the amplifier output terminal 212.

The secondary output stage 208 is enabled and the main output stage 206 is disabled.

The controller 224 disables the "up" signal that is input to the waveform generator 218 and enables the "dn" signal, which causes the Vy signal to ramp down.

The secondary output terminal 214 is de-coupled from the main output terminal 210 based on the coupling waveform Vy output from the waveform generator 218.

During de-coupling based on the coupling waveform, click and pop noise at the amplifier output terminal 212 is reduced.

After a selected de-coupling interval completes, the secondary output stage 208 is disabled.

Therefore, even though it may not be possible in practice to eliminate all noise sources, the circuit 200 operates to reduce noise and decouple it from the amplifier output. Thus, noise that appears at the secondary output stage is decoupled from the amplifier output due to operation of the signal coupler 216. Even if signal offsets exist, this noise can be ramped into the amplifier output in a gradual fashion by the coupling waveform Vy so that the noise is effectively filtered and/or reduced. A more detailed description of the operation of the circuit 200 to achieve signal amplification with noise reduction is provided below.

Op-Amp Free Waveform Generator

Figure 3:
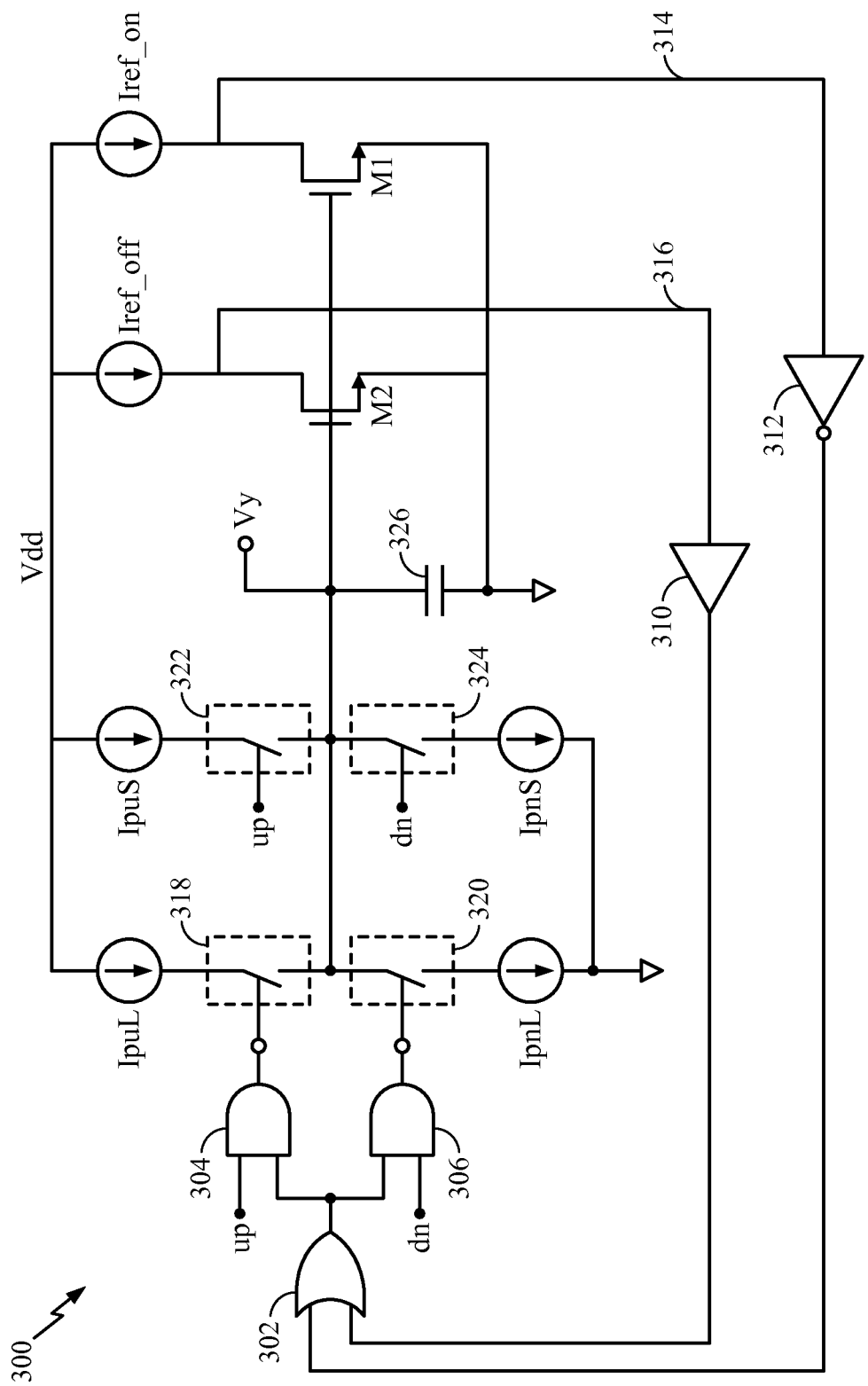
FIG. 3 shows an exemplary embodiment of an op-amp free waveform generator that is configured to generate a coupling waveform for use with the circuit shown in FIG. 2.

FIG. 3 shows an exemplary embodiment of an op-amp free waveform generator 300 that is configured to generate a coupling waveform for use with the circuit 200 shown in FIG. 2. For example, the waveform generator 300 is suitable for use as the waveform generator 218 shown in FIG. 2. In various exemplary embodiments, the waveform generator 300 is configured to provide one or more of the following functions without the use of an op-amp, which results in substantial circuit area reduction when compared to waveform generators that utilize op-amps.

1. Suppress click and pop noises due to glitches on output stage.
2. Eliminate any feed-through from signal source while signal source is powered on/off.
3. Decouple click and pop noise from offset voltage.
4. Reduce start up and shut down times.
5. Reduce required circuit area by approximately two thirds.

The waveform generator 300 comprises a first transistor (M1) connected to a first current source (Iref_on) to generate a first ramp control signal 314. A second transistor (M2) is connected to a second current source (Iref_off) to generate a second ramp control signal 316. The transistors M1 and M2 generate the first and second ramp control signals 314 and 316 based on the state of a ramp voltage Vy that is coupled to the bases of the transistors M1 and M2.

The first ramp control signal 314 is input to an inverter 312 that has an output connected to a first input of an "OR" gate 302. The second ramp control signal 316 is input to a buffer 310 that has an output connected to a second input of the "OR" gate 302. An output of the "OR" gate 302 is input to "AND" gates 304 and 306. The "AND" gates 304 and 306 also receive up "up" and down "dn" control signals as inputs. For example, the up and dn control signals are generated by the controller 224 or other system entity at the device. In an exemplary embodiment, when the system that employs the waveform generator 300 (i.e., circuit 200 shown in FIG. 2) is powered on, the up signal is set to "1" and the dn signal is set to "0." When the system is powered down, the up signal is set to "0" and the dn signal is set to "1."

The outputs of the AND gates 304 and 306 are configured to control the switches 318 and 320, respectively. The switches 318 and 320 connect the Vy signal line to either a power supply (Vdd) or signal ground through large current sources IpuL and IpnL. Switches 322 and 324 also connect the Vy signal line to either the power supply (Vdd) or signal ground through small current sources IpuS and IpnS based on the up and dn control signals.

A capacitor 326 is connected to the Vy signal line and charges or discharges based on the state of the switches 318-324 to generate a waveform that appears on the Vy signal line. The waveform that appears on the Vy signal line operates to control the operation of the transistors M1 and M3. In an exemplary embodiment, the sizes of the current sources (IpuL, IpuS, IpnL, and IpnS) and the capacitor 326 are configured to meet at least one of the required start-up time, the required shut-down time, and/or noise level specifications in different applications. In an exemplary embodiment, the sizes of the current sources are programmable by a controller (not shown) or other entity at the device according to the desired start up time and noise level requirement. In an exemplary embodiment, the transistors M1/M2 are scaled replicas of a control switch used in the signal coupler 216 or other driver that is operated by the coupling waveform Vy.

During operation, the transistors M1 and M2 act as current comparators that operate to control fast and slow ramp phases that appear on the Vy signal line. In an exemplary embodiment, the Vy signal is coupled to drive an amplifier output switch, for example, the signal coupler 216 shown in FIG. 2. In an exemplary embodiment, the transistors M1 and M2 are scaled replicas of the transistor used in the signal coupler 216 meaning that the devices M1 and M2 use the same unit element as the amplifier output switch (i.e., signal coupler 216) that they are replicating. For example, the signal coupler 216 may use one hundred of a certain unit MOS device having width 'w' and length 'l'. Thus, M1 and M2 would also use the same unit MOS device having width 'w' and length 'l' but in smaller numbers. This is done to preserve the fundamental parameters of the MOS device like Vt, Idsat, and other device characteristics.

It should also be noted that the novel ramp generator 300 is suitable for use in other applications in addition to click and pop reduction for audio headsets. For example, the ramp generator 300 can be used, for example, to provide on/off power switching and/or microphone bias pop prevention.

Figure 4:
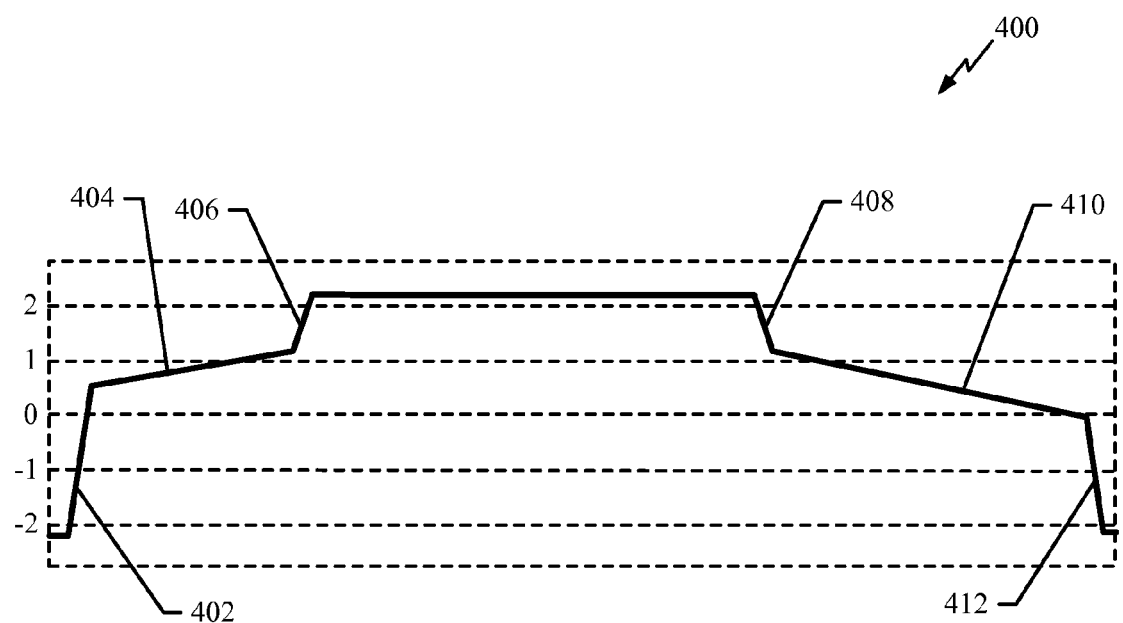
FIG. 4 shows an exemplary graph that illustrates a plot of a coupling waveform generated by the operation of the op-amp free waveform generator shown in FIG. 3.

FIG. 4 shows an exemplary graph 400 that illustrates a plot of the coupling waveform Vy generated by the operation of the op-amp free waveform generator 300. For example, the controller 224 operates to disable the "dn" signal and enable the "up" signal. During power up, initially both current sources (IpuL and IpuS) inject current to the capacitor 326, which results in the control voltage Vy having a fast ramp-up phase 402. When the off current comparator (M2) transitions from off to slightly turned on due to the Vy signal, the larger current source (IpuL) is shut off by the operation of gates 310, 302, and 304 so that only the smaller current source (IpuS) provides current into the capacitor 326 thereby generating the Vy control voltage to have a slow ramp-up (shown at 404), which turns on the signal coupler 216 slowly to get good click and pop noise performance.

When the on current comparator (M1) is very well on, the larger current source (IpuL) will be turned on again by the operation of gates 312, 302 and 304 to provide a fast ramp-up for the control voltage Vy (shown at 406). The fast ramp-up 406 operates to reduce the hard pull on switch induced CnP noise. In various exemplary embodiments, the fast-slow-fast waveform generator 300 will have good CnP noise performance and fast power up times.

During power down, the sequence is reversed to provide the down ramps shown at 408, 410 and 412. For example, the controller 224 operates to disable the "up" signal and enable the "dn" signal. The same comparators are used to control the sequence. Either a fast-slow-fast ramp phases or a fast-slow ramp can be implemented. The third phase shown at 412 may not be necessary since the hard pull off switch causes less CnP noise than the hard pull on switch.

Figure 5:
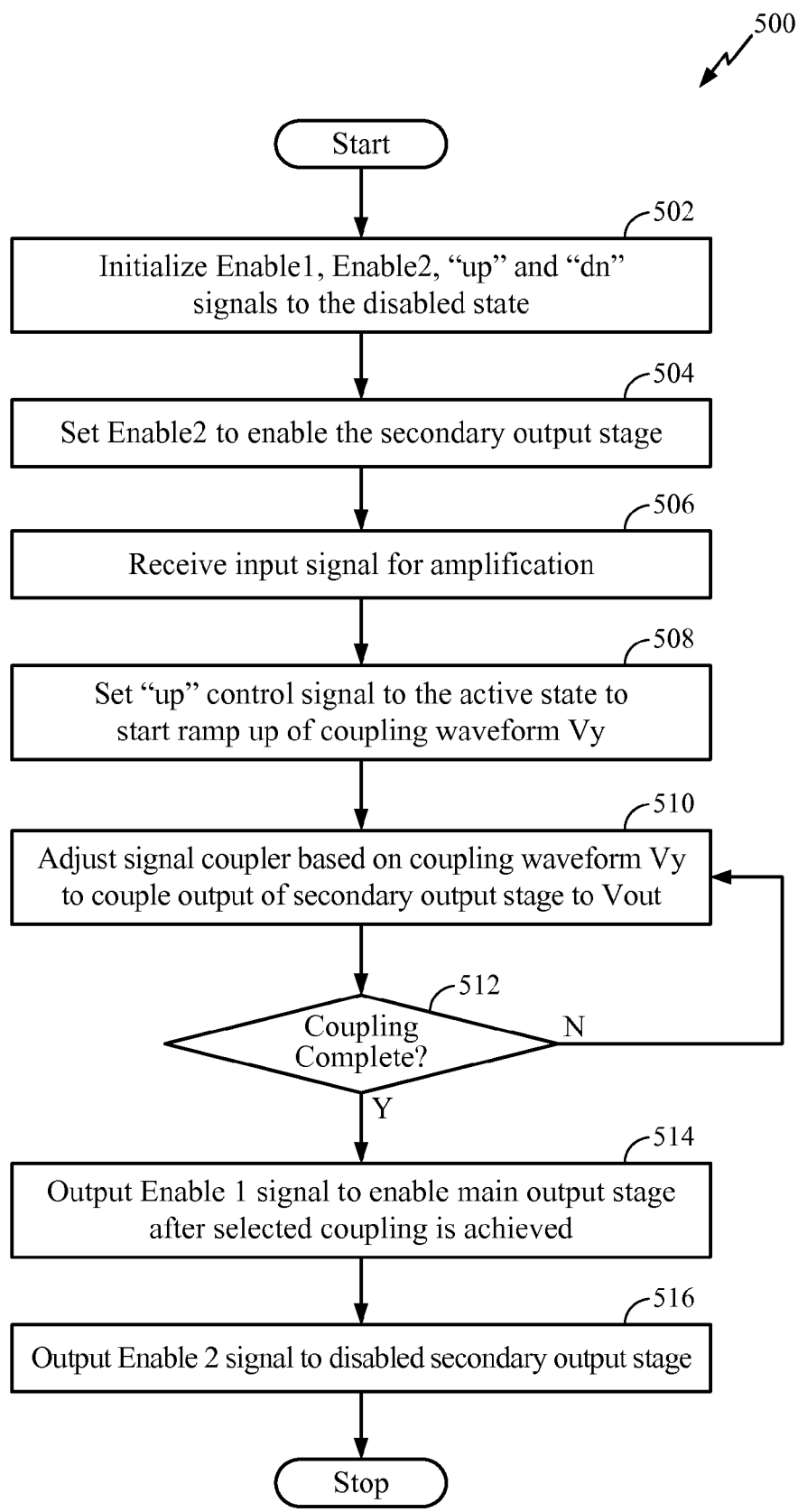
FIG. 5 shows an exemplary embodiment of a method for reducing noise associated with amplifier start-up.

FIG. 5 shows an exemplary embodiment of a method 500 for reducing noise associated with amplifier start-up. For example, the method 500 is suitable for use with the circuit 200 shown in FIG. 2 and the waveform generator 300 shown in FIG. 3.

At block 502, the circuit 200 is in a power down state and the controller 224 initializes the Enable1, Enable2, "up" and "dn" signals to be in the disabled state.

At block 504, the Enable2 signal is set to enable operation of the secondary output stage 208. In an aspect, the controller 224 operates to set the Enable2 signal to the enabled state.

At block 506, an input signal to be amplified is received. For example, the input signal may be an audio signal that is to be amplified for use with an audio headset. In one implementation, the input signal is generated by the source 236 and coupled to the resistors 226 and 228.

At block 508, the "up" signal is set to the enabled state to start the ramp up of the coupling waveform Vy. In an aspect, the controller 224 operates to set the "up" signal to the enabled state. The capacitor 326 begins charging according to the ramp up voltage characteristics shown in FIG. 4.

At block 510, the signal coupler 216 is adjusted based on the generated coupling waveform Vy to couple the output 214 of the secondary amplifier stage 208 to Vout at node 210.

At block 512, a determination is made as to whether the coupling of the output 214 of the secondary output stage 208 to Vout 210 is complete. For example, the coupling may occur for a selected coupling time interval, for a plurality of coupling phases, or may occur until a particular threshold value of the coupling waveform is reached. If the coupling is not complete, the method proceeds to block 510. If the coupling is complete, the method proceeds to block 514.

At block 514, the main output stage is enabled. For example, the controller 224 generates the Enable1 signal to enable the main output stage 206 after the signal coupler 216 has reached its fully coupled state. For example, in the fully coupled state, the signal coupler 216 is set to its minimum resistance value.

At block 516, the secondary output stage is disabled. For example, the controller 224 generates the Enable2 signal to disable the secondary output stage 208.

Thus, the method 500 is performed during start-up to amplify an input signal while reducing noise, such as click and pop noise. For example, in an exemplary embodiment, the method operates such that the output 214 of the secondary output stage 208 is gradually coupled to the output 210 of the main output stage 206 (Vout) during start up so that the level of clicks, pops, and/or other noise is reduced. After an initial coupling time interval, the main output stage 206 of the amplifier is enabled and the secondary output stage 208 is disabled.

Figure 6:
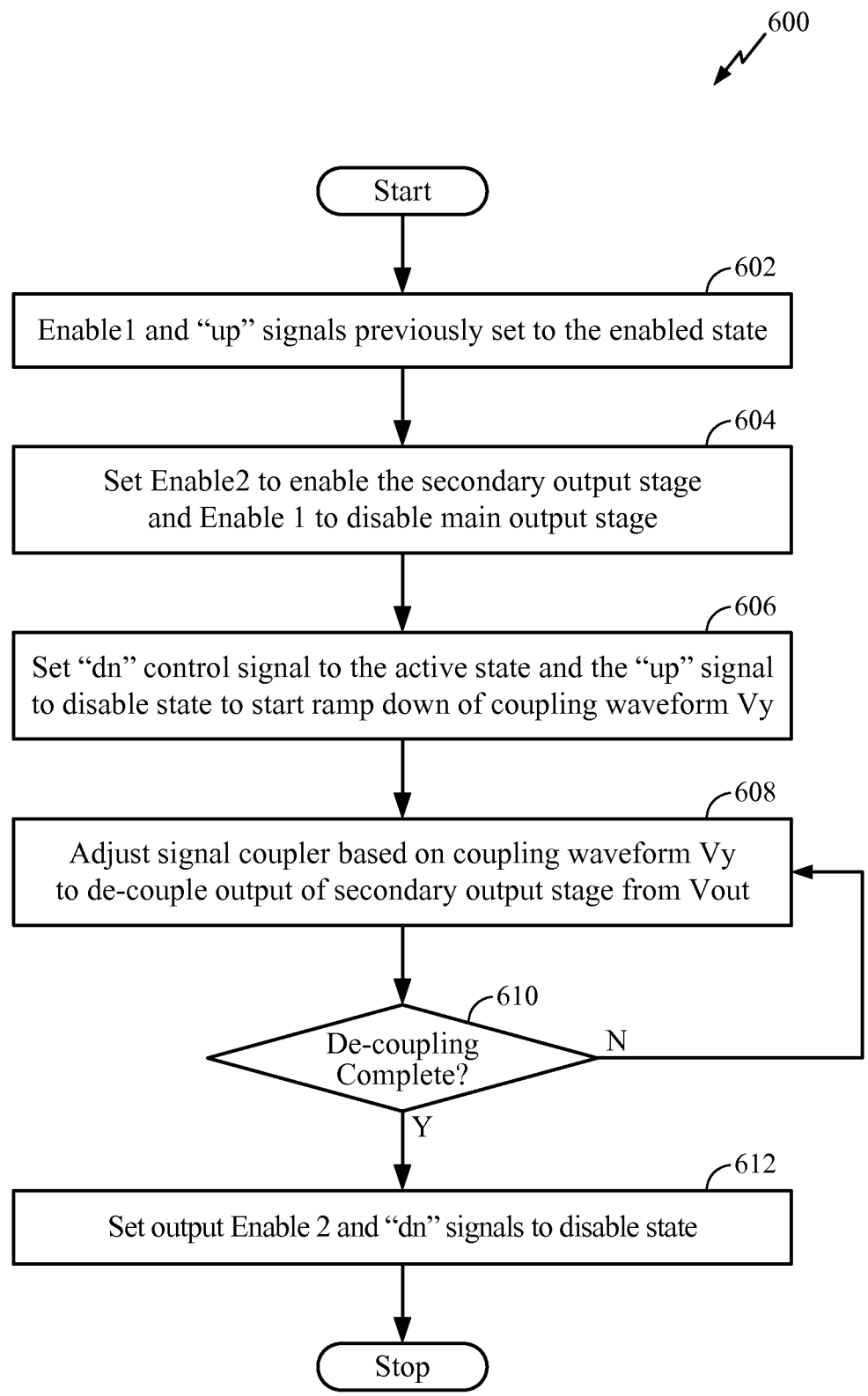
FIG. 6 shows an exemplary embodiment of a method for reducing noise associated with amplifier shut-down.

FIG. 6 shows an exemplary embodiment of a method 600 for reducing noise associated with amplifier shut-down. For example, the method 600 is suitable for use with the amplifier circuit 200 shown in FIG. 2 and the waveform generator 300 shown in FIG. 3. It will be assumed that prior to shut down, the main output stage 206 is enabled, the secondary output stage 208 is disabled, and the signal coupler 216 is set to provide its minimum resistance value.

At block 602, in the current state, the Enable1 signal and the "up" signal are in the enabled state. For example, the controller 224 set these signals to the enabled state during a power up sequence.

At block 604, the Enable 2 signal is set to the enable state to enable the secondary amplifier stage output at node 214 to be coupled to Vout at node 210. The Enable1 signal is set to the disabled state to disable the main amplifier stage. For example, the controller 224 sets the Enable1 and Enable2 signal states.

At block 606, the "dn" signal is set to the enabled state and the "up" signal is set to the disabled state. This starts the ramp down of the coupling waveform Vy that is output from the waveform generator 300. For example, the controller 224 operates to set the "dn" and "up" signals to the appropriate state. The capacitor 326 begins discharging according to the ramp down voltage characteristics shown in FIG. 4.

At block 608, the signal coupler 216 is controlled based on the coupling waveform Vy to de-couple the output 214 of the secondary output stage 208 from Vout at node 210.

At block 610, a determination is made as to whether the de-coupling of the output of the secondary output stage at node 214 from Vout at node 210 is complete. For example, the de-coupling may occur for a selected de-coupling time interval, until a selected number of ramp phases occur, or until a particular threshold value is reached. If the de-coupling is not complete, the method proceeds to block 608. If the de-coupling is complete, the method proceeds to block 612.

At block 612, the secondary output stage is disabled. For example, the controller 224 generates the Enable 2 signal to disable the secondary output stage 208. Furthermore, the "dn" signal is also set to the disabled state.

Thus, the method 600 is performed during amplifier shutdown while reducing noise, such as click and pop noise. For example, in an exemplary embodiment, coupling waveform Vy is generated so that the output 214 of the secondary output stage 208 is gradually de-coupled from the output 210 of the main output stage 206 (Vout) during shut down, thereby reducing the level of clicks, pops, and/or other noise on the amplifier output (Vout).

Figure 7:
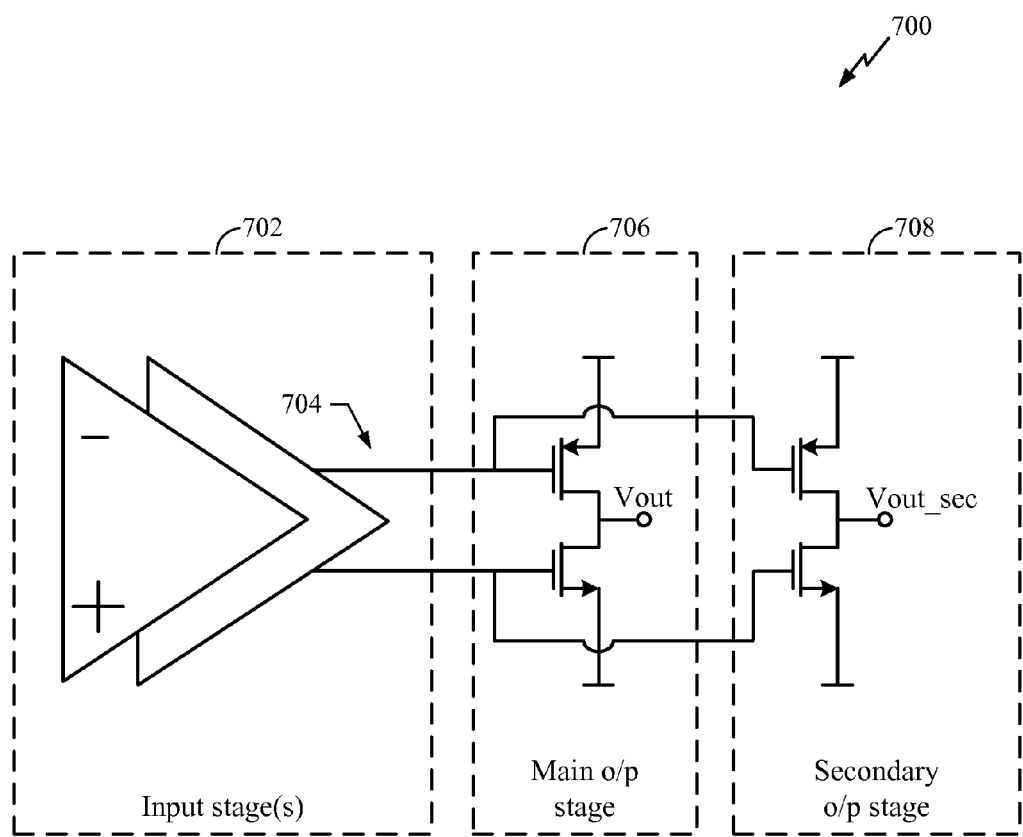
FIG. 7 shows an exemplary embodiment of an amplifier circuit configured for providing signal amplification with reduced noise.

FIG. 7 shows an exemplary embodiment of an amplifier circuit 700 configured for providing amplification with reduced noise. For example, the circuit 700 is suitable for use as the amplifier 202 shown in FIG. 2. The circuit 700 comprises one or more input stages 702 that receive an input signal to be amplified and produce an intermediate signal 704. The intermediate signal 704 is input to both of a main output stage 706, and a secondary output stage 708. The main output stage 706 outputs the amplified signal Vout. The secondary output stage 708 outputs a copy of the amplified signal Vout_sec. In various implementations, the outputs of the main 706 and secondary 708 output stages are combined by the signal coupler 216 shown in FIG. 2 to provide reduced click and pop noise during amplifier startup and shutdown.

Alternative Embodiments

In various exemplary embodiments, sections of the waveform generator 300 can be configured with alternative embodiments as follows.

Figure 8:
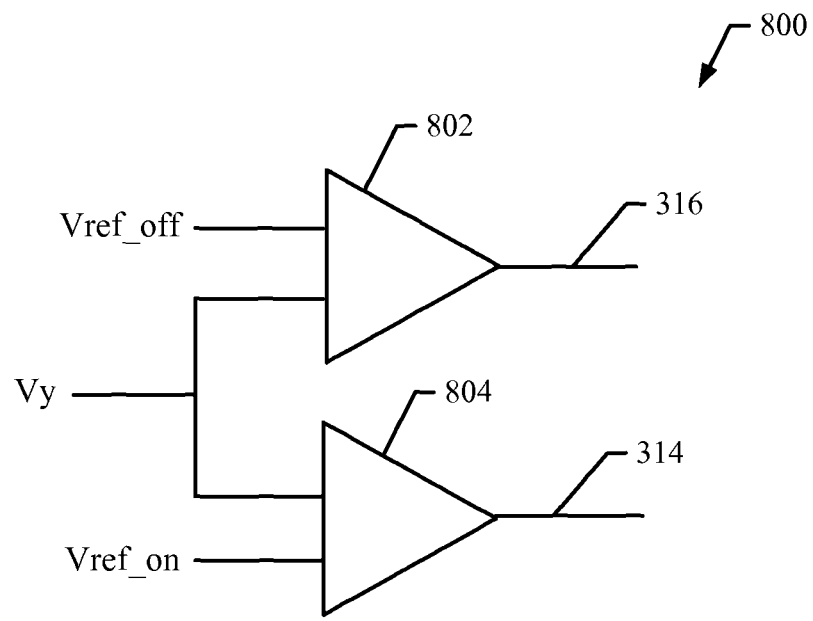
FIG. 8 shows an exemplary embodiment of a voltage comparator for use in a waveform generator.

FIG. 8 shows an exemplary embodiment of a voltage comparator 800 for use in the waveform generator 300. For example, the current sources Iref_off and Iref_on and the transistors M1 and M2 in the waveform generator 300 can be replaced by the voltage comparators 802 and 804 shown in FIG. 8. During operation, the two voltage comparators 802 and 804 receive and compare the generated Vy signal to two reference voltages (Vref_on, Vref_off) to generate the first ramp control signal 314 and the second ramp control signal 316. The ramp control signals are then used to drive the gates 310 and 312. In an exemplary embodiment, any suitable voltage references, such as resistor networks, can be used to generate the Vref_off and Vref_on voltage reference signals.

Figure 9:
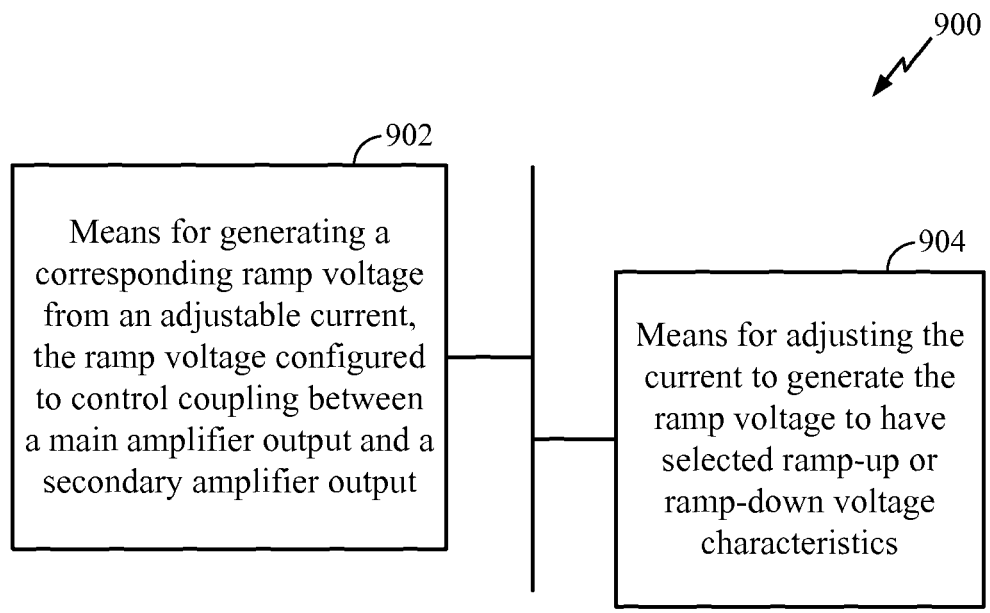
FIG. 9 shows an exemplary embodiment of a waveform generator apparatus configured to operate with an amplifier to reduce noise.

FIG. 9 shows an exemplary embodiment of a waveform generator apparatus 900 configured to operate with an amplifier to reduce noise. For example, the apparatus 900 is suitable for use as the waveform generator 300 shown in FIG. 3. In an aspect, the apparatus 900 is implemented by one or more modules configured to provide the functions as described herein. For example, in an aspect, each module comprises hardware and/or hardware executing software.

The apparatus 900 comprises a first module comprising means (902) for generating a corresponding ramp voltage from an adjustable current, the ramp voltage configured to control coupling between a main amplifier output and a secondary amplifier output, which in an aspect comprises the capacitor 326 shown in FIG. 3.

The apparatus 900 also comprises a second module comprising means (904) for adjusting the current to generate the ramp voltage to have selected ramp-up or ramp-down voltage characteristics, which in an aspect comprises the transistors M1 and M2 shown in FIG. 3.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software executed by a processor, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   at least one capacitor configured to receive an adjustable current and to generate a ramp voltage at a node coupled to a signal coupler between a main amplifier output and a secondary amplifier output, the signal coupler having a variable resistance based on the ramp voltage; and
   at least one comparator configured to adjust the adjustable current.

2. The apparatus of claim 1, the adjustable current generated by at least one of a charging current source and a discharging current source.

3. The apparatus of claim 1, the at least one comparator comprising a first transistor configured to receive the ramp voltage and to generate a first control signal.

4. The apparatus of claim 3, the at least one comparator comprising a second transistor configured to receive the ramp voltage and to generate a second control signal.

5. The apparatus of claim 4, the first and second control signals configured to cause the ramp voltage to have multiple ramp stages.

6. The apparatus of claim 1, the at least one comparator comprising a first comparator configured to compare the ramp voltage to a first voltage reference to generate a transition in a first control signal.

7. The apparatus of claim 6, the at least one comparator comprising a second comparator configured to compare the ramp voltage to a second voltage reference to generate a transition in a second control signal.

8. The apparatus of claim 7, the first and second control signals configured to cause the ramp voltage to have multiple ramp stages.

9. The apparatus of claim 1, wherein the ramp voltage is configured to have selected ramp-up or ramp-down voltage characteristics.

10. The apparatus of claim 1, wherein the signal coupler includes a load resistor.

11. The apparatus of claim 1, the at least one comparator comprising a first transistor and a second transistor, wherein a gate of the first transistor is coupled to the node, wherein an output of the first transistor is coupled to first logic circuitry, wherein a gate of the second transistor is coupled to the node, and wherein an output of the second transistor is coupled to second logic circuitry.

12. The apparatus of claim 11, wherein the first logic circuitry includes an inverter, an OR gate, and two AND gates, wherein the second logic circuitry includes a buffer, the OR gate, and the two AND gates, and wherein the first logic circuitry and the second logic circuitry are coupled to switches coupled to the node.

13. An apparatus comprising:
   means for generating a ramp voltage based on an adjustable current, the ramp voltage generated at a node coupled to means for coupling between a main amplifier output and a secondary amplifier output, the means for coupling having a variable resistance based on the ramp voltage; and
   means for adjusting the adjustable current.

14. The apparatus of claim 13, the adjustable current generated by at least one charging current source and at least one discharging current source.

15. The apparatus of claim 13, the means for adjusting comprising a first transistor configured to receive the ramp voltage and to generate a first control signal.

16. The apparatus of claim 15, the means for adjusting comprising a second transistor configured to receive the ramp voltage and to generate a second control signal.

17. The apparatus of claim 16, the first and second control signals configured to cause the ramp voltage to have multiple ramp stages.

18. The apparatus of claim 13, the means for adjusting comprising a first comparator configured to compare the ramp voltage to a first voltage reference to generate a transition in a first control signal.

19. The apparatus of claim 18, the means for adjusting comprising a second comparator configured to compare the ramp voltage to a second voltage reference to generate a transition in a second control signal.

20. The apparatus of claim 19, the first and second control signals configured to cause the ramp voltage to have multiple ramp stages.

* * * * *